United States Patent
Yoshida

(10) Patent No.: US 11,067,864 B2
(45) Date of Patent: Jul. 20, 2021

(54) DISPLAY DEVICE, LIQUID CRYSTAL DISPLAY DEVICE, AND ORGANIC EL DISPLAY DEVICE

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 11 days.

(21) Appl. No.: 16/299,194

(22) Filed: Mar. 12, 2019

(65) Prior Publication Data

US 2019/0285955 A1    Sep. 19, 2019

(30) Foreign Application Priority Data

Mar. 16, 2018   (JP) .............................. JP2018-049510

(51) Int. Cl.

| G02F 1/1362 | (2006.01) |
|---|---|
| G02F 1/1335 | (2006.01) |
| G02F 1/1343 | (2006.01) |
| G02F 1/1368 | (2006.01) |
| H01L 27/12 | (2006.01) |
| H01L 29/786 | (2006.01) |

(Continued)

(52) U.S. Cl.
CPC ...... *G02F 1/136286* (2013.01); *G02F 1/1368* (2013.01); *G02F 1/13439* (2013.01); *G02F 1/133553* (2013.01); *G02F 2201/56* (2013.01); *H01L 27/1225* (2013.01); *H01L 27/1244* (2013.01); *H01L 27/1255* (2013.01); *H01L 27/3262* (2013.01); *H01L 27/3265* (2013.01); *H01L 27/3276* (2013.01); *H01L 29/7869* (2013.01); *H01L 29/78672* (2013.01); *H01L 51/0097* (2013.01); *H01L 2251/5315* (2013.01); *H01L 2251/5338* (2013.01); *H01L 2251/5392* (2013.01)

(58) Field of Classification Search
CPC ......... G02F 1/136286; G02F 1/133553; G02F 1/13439; G02F 1/1368
See application file for complete search history.

(56) References Cited

U.S. PATENT DOCUMENTS

| 2008/0117497 A1 | 5/2008 | Shimodaira |
|---|---|---|
| 2008/0225216 A1 | 9/2008 | Shimodaira |

(Continued)

FOREIGN PATENT DOCUMENTS

| JP | 2008-257191 A | 10/2008 |
|---|---|---|
| JP | 2010-032760 A | 2/2010 |

*Primary Examiner* — Dung T Nguyen
(74) *Attorney, Agent, or Firm* — Keating & Bennett, LLP

(57) ABSTRACT

An embodiment of the present invention provides a display device which allows for the area of a wiring diverting region to be reduced. The display device (1) includes: a substrate (100) having a displaying region (30) and a non-displaying region (10); a plurality of first switching elements (TFT1, TFT2); a plurality of gate lines (50) each of which is respectively connected to a gate of one or more of the plurality of first switching elements; a plurality of second switching elements (TFT3); a plurality of sub gate lines (60) each of which is respectively connected to a gate of one or more of the plurality of second switching elements; and one or more connecting lines (70) each of which connects a respective one of the plurality of gate lines (50) to a respective one of the plurality of sub gate lines (60).

18 Claims, 15 Drawing Sheets

(51) Int. Cl.
  *H01L 51/00* (2006.01)
  *H01L 27/32* (2006.01)

(56) References Cited

U.S. PATENT DOCUMENTS

2010/0026611 A1    2/2010  Igeta et al.
2015/0293546 A1*  10/2015  Tanaka ............ H03K 17/04206
                                                   327/541

* cited by examiner

FIG. 6
(a)
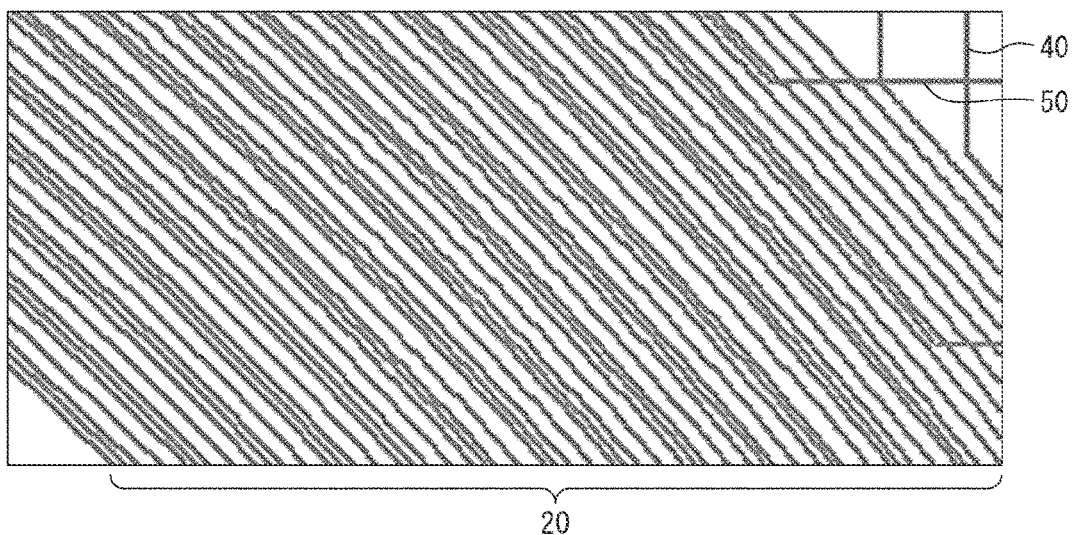
(b)
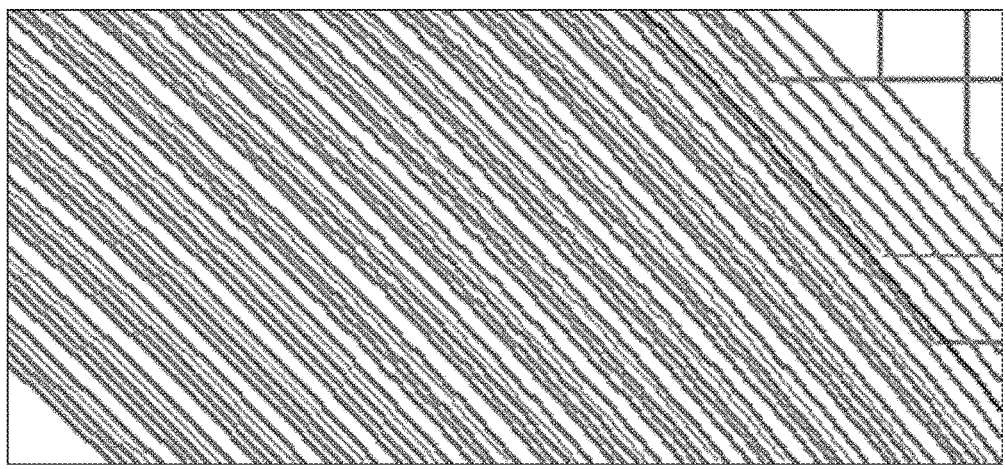

FIG. 15
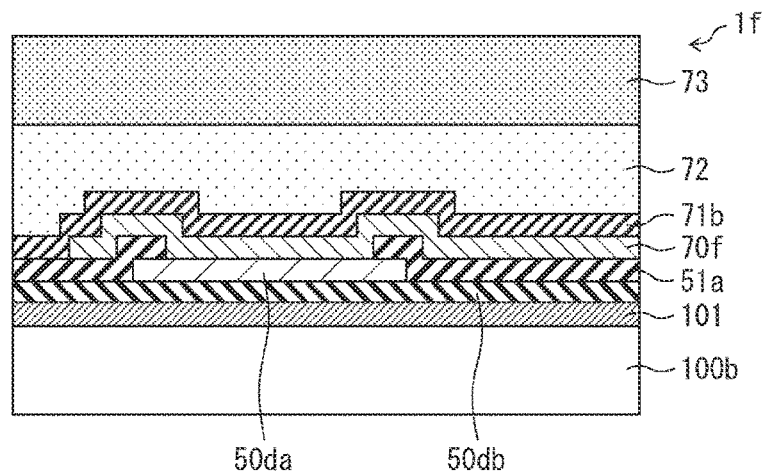
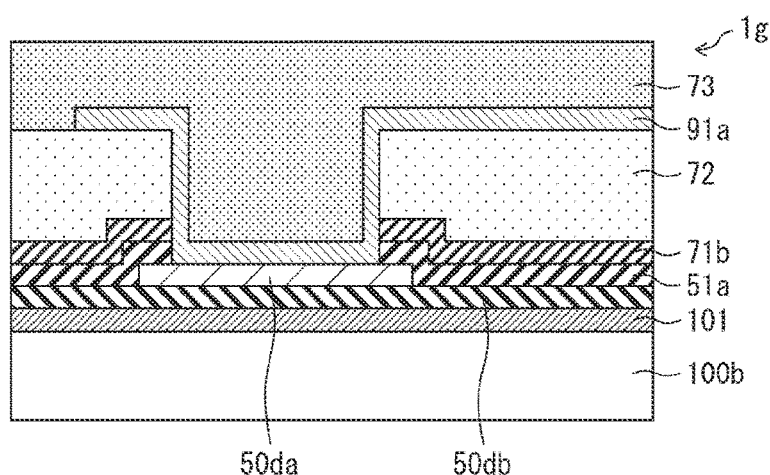
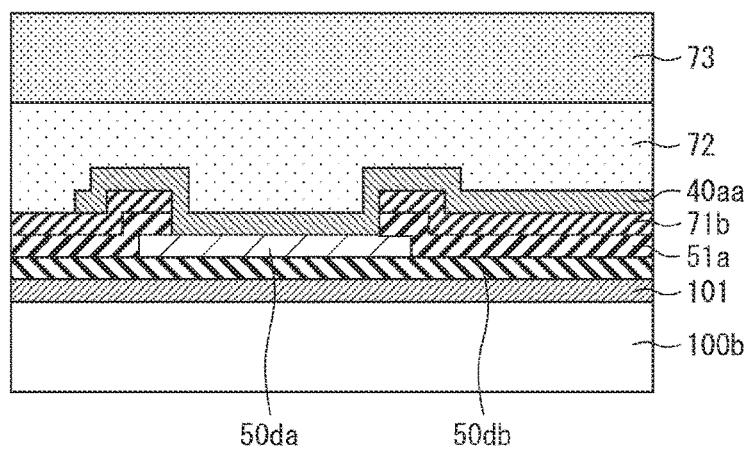

DISPLAY DEVICE, LIQUID CRYSTAL DISPLAY DEVICE, AND ORGANIC EL DISPLAY DEVICE

This Nonprovisional application claims priority under 35 U.S.C. § 119 on Patent Application No. 2018-049510 filed in Japan on Mar. 16, 2018, the entire contents of which are hereby incorporated by reference.

TECHNICAL FIELD

The present invention relates to a display device, a liquid crystal display device, and an organic electroluminescent (hereinafter, "EL") display device.

BACKGROUND ART

Conventionally, there have been measuring instruments, amusement devices, and the like which utilize a liquid crystal display device employing multi-pixels. In some cases, such liquid crystal display devices have an opening or cut-out section which is, for example, formed so as to be surrounded a displaying region. In such cases, faulty displaying may occur in areas peripheral to the opening. In some cases, in order to reduce such faulty displaying, it is necessary provide a large non-displaying region in areas peripheral to the opening.

This reason for this is as follows. Wiring cannot be provided in the opening because the substrate does not exist in the opening. It is therefore necessary to provide, peripherally to the opening, a wiring diverting region for diverting wiring such as gate lines and data lines. A sealing material for sealing the liquid crystals must also be provided in the wiring diverting region, and thus the wiring diverting region must have a certain width. However, it is preferable to keep the width of the wiring diverting region small so as to avoid a decrease in the size of the displaying region. The various wires are therefore provided densely in the wiring diverting region.

In a case where a photo-curing agent is used as the sealing material, light (ultraviolet rays or visible light) is irradiated from an array substrate side. Wiring such as gate lines and data lines are provided on this array substrate, and in a case where the wires are provided densely, there is the risk that curing will not be adequately achieved. This can result in an un-cured component of the sealing material entering into the liquid crystal layer and causing faulty displaying.

Furthermore, a liquid crystal display device employing multi-pixels that has a configuration in which two gate lines (a first gate line and a second gate line also known as a "sub gate line") are provided for each pixel tends to have even more densely provided wiring in the wiring diverting region. Patent Literature 1, for example, discloses a configuration in which, in a region including an opening, gate lines and data lines are diverted to the periphery of the opening so as to avoid the opening, and, further, common signal lines which supply the same signal to each pixel row are bundled by a connecting wire.

Patent Literature 2 discloses a configuration, nearly identical to that of Patent Literature 1, in which power supply lines are bundled.

CITATION LIST

Patent Literature

[Patent Literature 1]
Japanese Patent Application Publication, Tokukai, No. 2010-032760 (Publication Date: Feb. 12, 2010)

[Patent Literature 2]
Japanese Patent Application Publication, Tokukai, No. 2008-257191 (Publication Date: Oct. 23, 2008)

SUMMARY OF INVENTION

Technical Problem

Unfortunately, in a configuration having gate lines and sub gate lines, using the techniques disclosed in Patent Literatures 1 and 2 as-is would be not be sufficient for reducing the area of a wiring diverting region.

The present invention has been made in view of the above problem. An object of the present invention is to provide a liquid crystal display device which allows for the area of a wiring diverting region to be reduced in a configuration including gate lines and sub gate lines.

Solution to Problem

In order to solve the above problem, a display device in accordance with an aspect of the present invention includes: a substrate having a displaying region and a non-displaying region; a plurality of first switching elements; a plurality of gate lines each of which is respectively connected to a gate of one or more of the plurality of first switching elements; a plurality of second switching elements; a plurality of sub gate lines each of which is respectively connected to a gate of one or more of the plurality of second switching elements; and one or more connecting lines each of which connects a respective one of the plurality of gate lines to a respective one of the plurality of sub gate lines.

Advantageous Effects of Invention

An aspect of the present invention makes it possible to provide a display device which allows for the area of a wiring diverting region to be reduced in a configuration including gate lines and sub gate lines.

BRIEF DESCRIPTION OF DRAWINGS

FIG. 1 illustrates a configuration of main parts of the liquid crystal display device.

Figure 2:
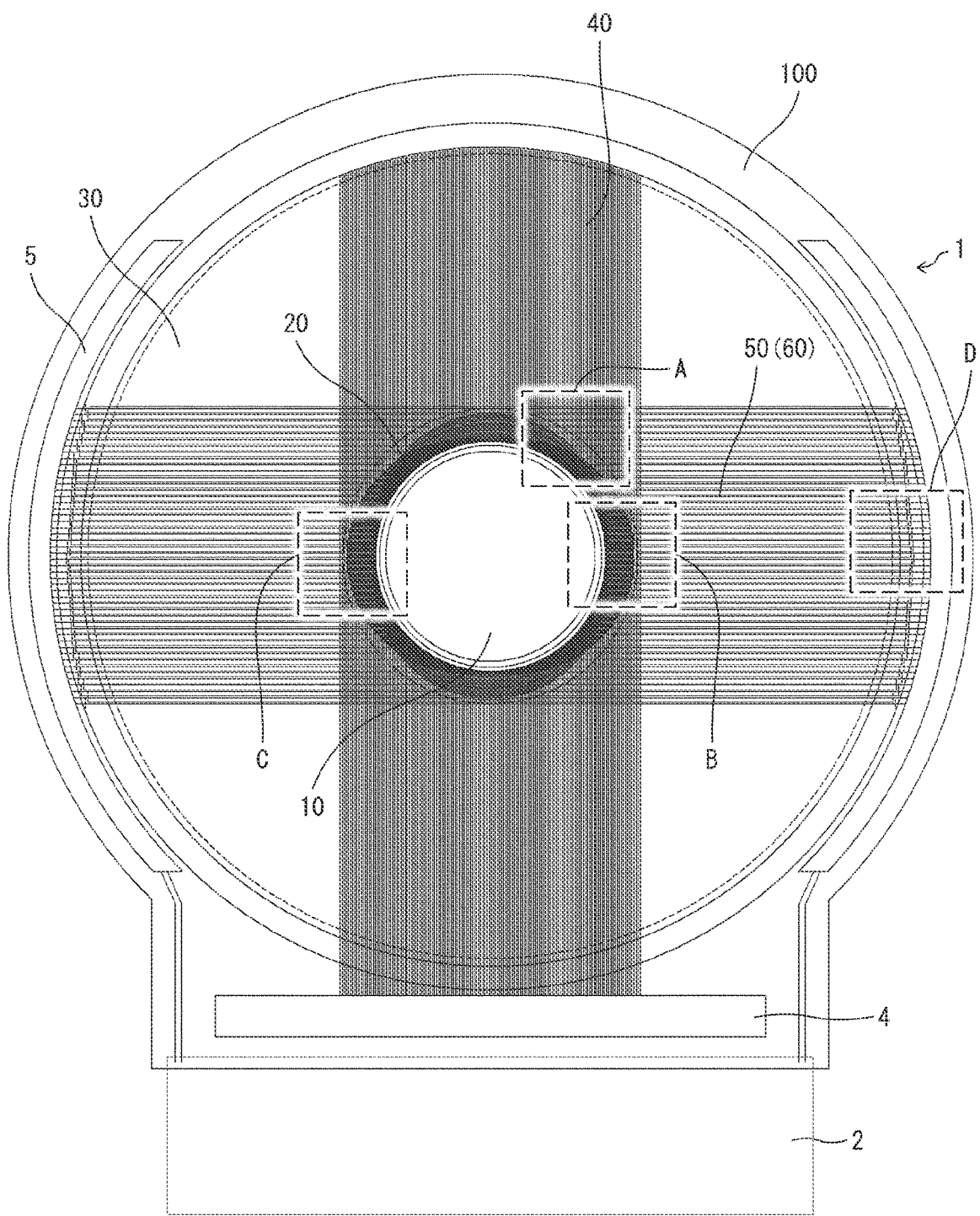
FIG. 2 is a diagram illustrating an overall configuration of the liquid crystal display device in accordance with Embodiment 1.
Figure 5:
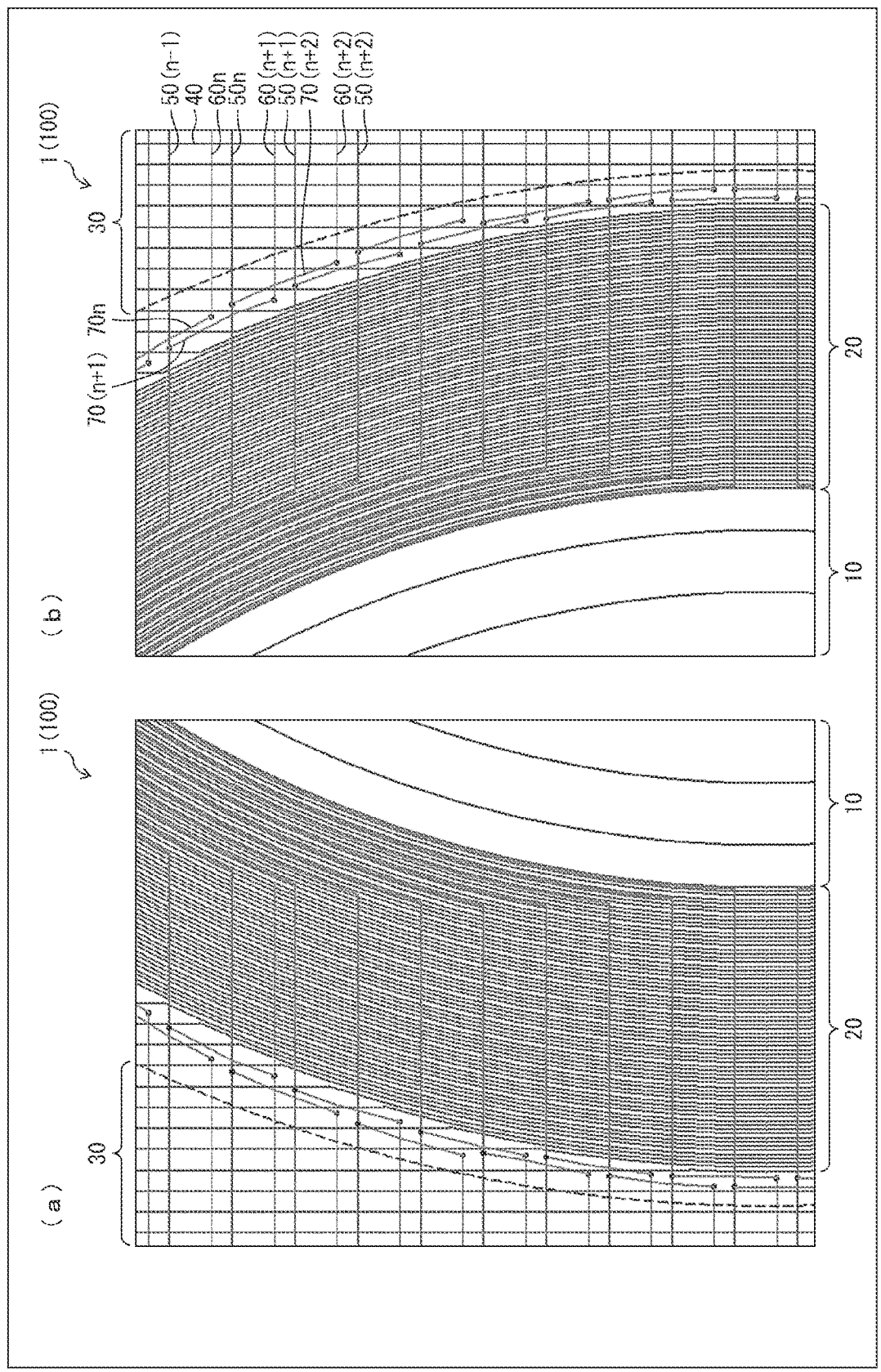

(a) of FIG. 5 is an enlarged view of section C of FIG. 2.
(b) of FIG. 5 is an enlarged view of section B of FIG. 2.

Figure 3:
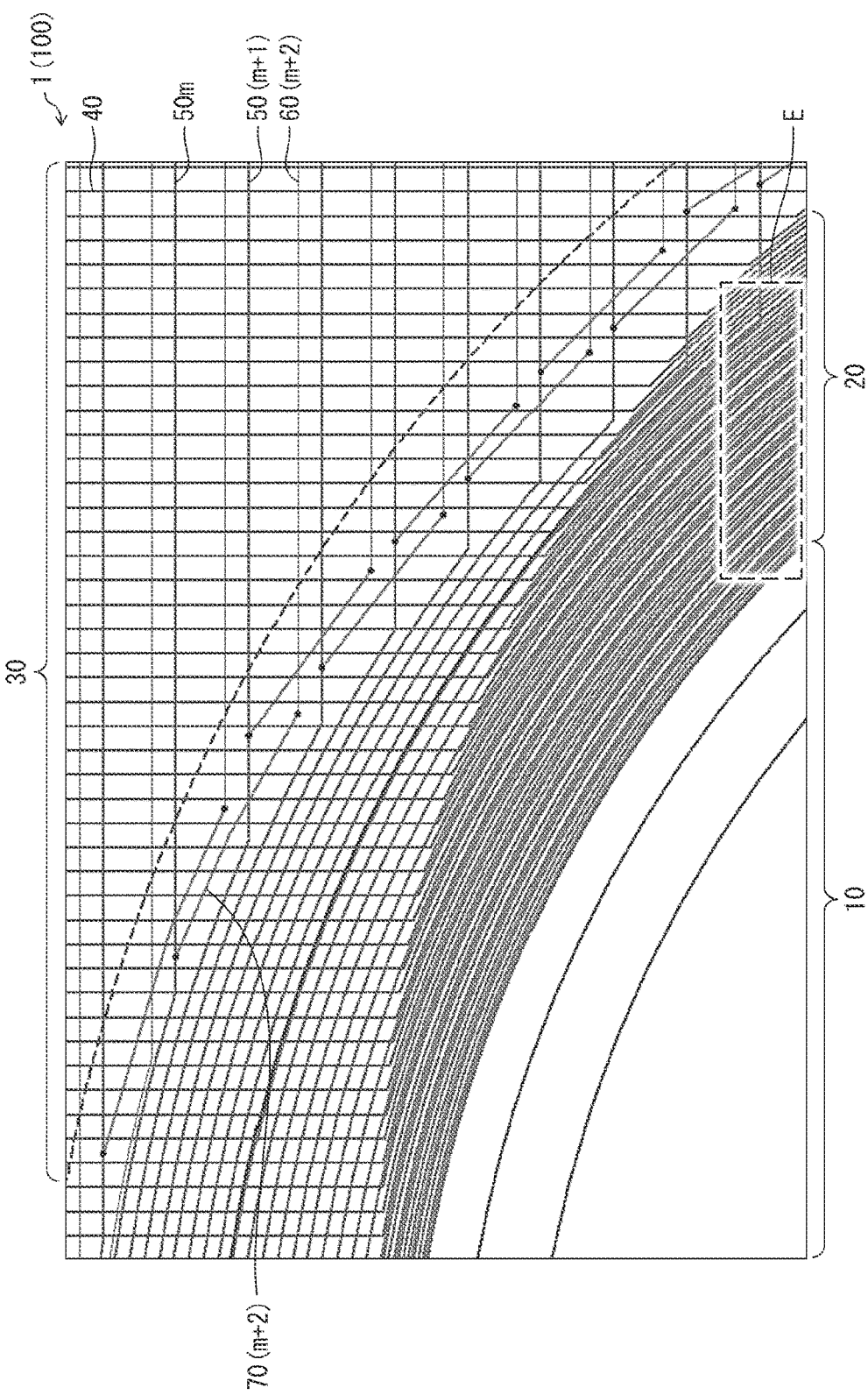
FIG. 3 is an enlarged view of section A of FIG. 2.

(a) of FIG. 6 is an enlarged view of section E of FIG. 3.
(b) of FIG. 6 is a diagram illustrating a comparative example.

Figure 7:
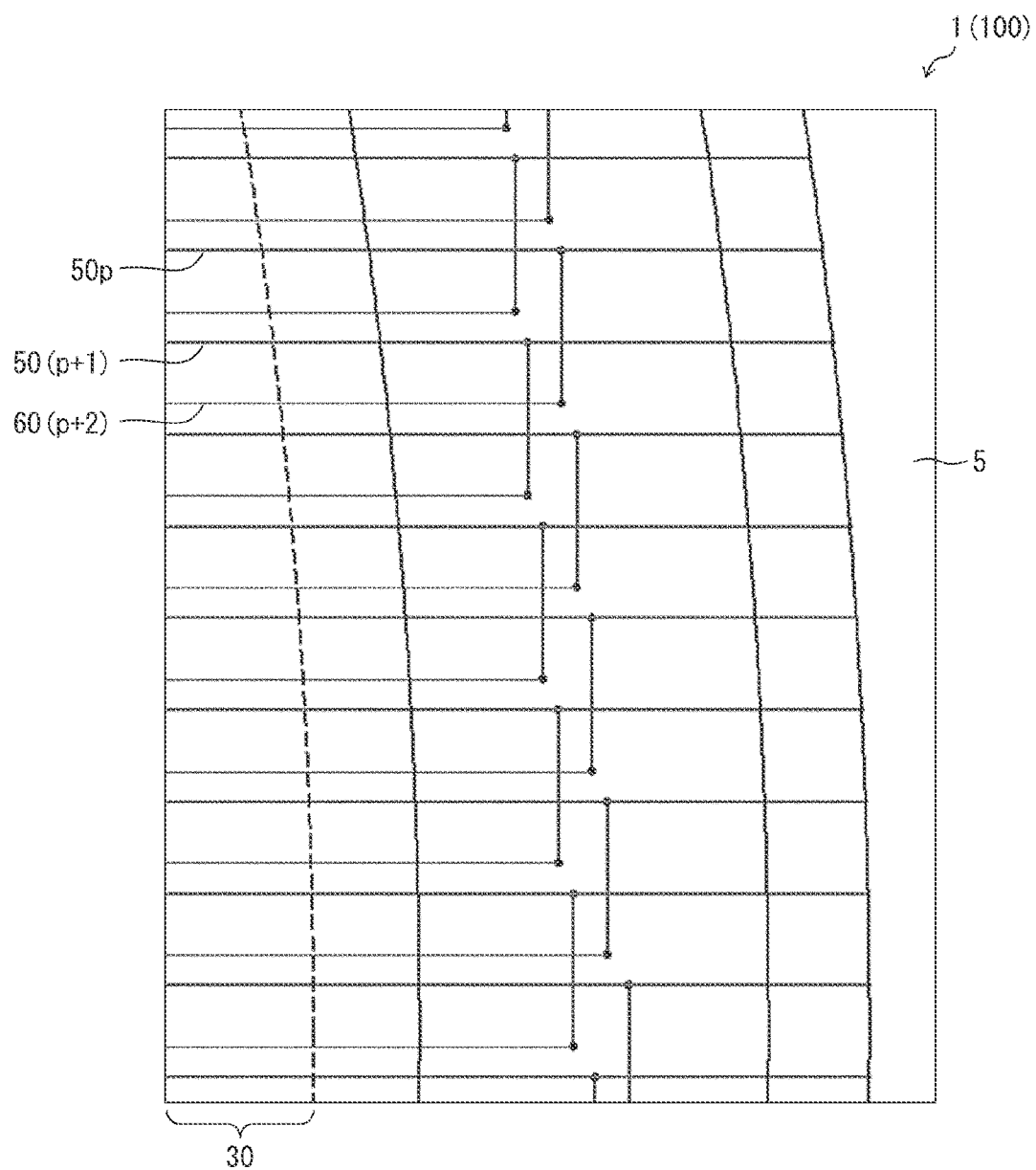

FIG. 7 is an enlarged view of section D of FIG. 2.

Figure 8:
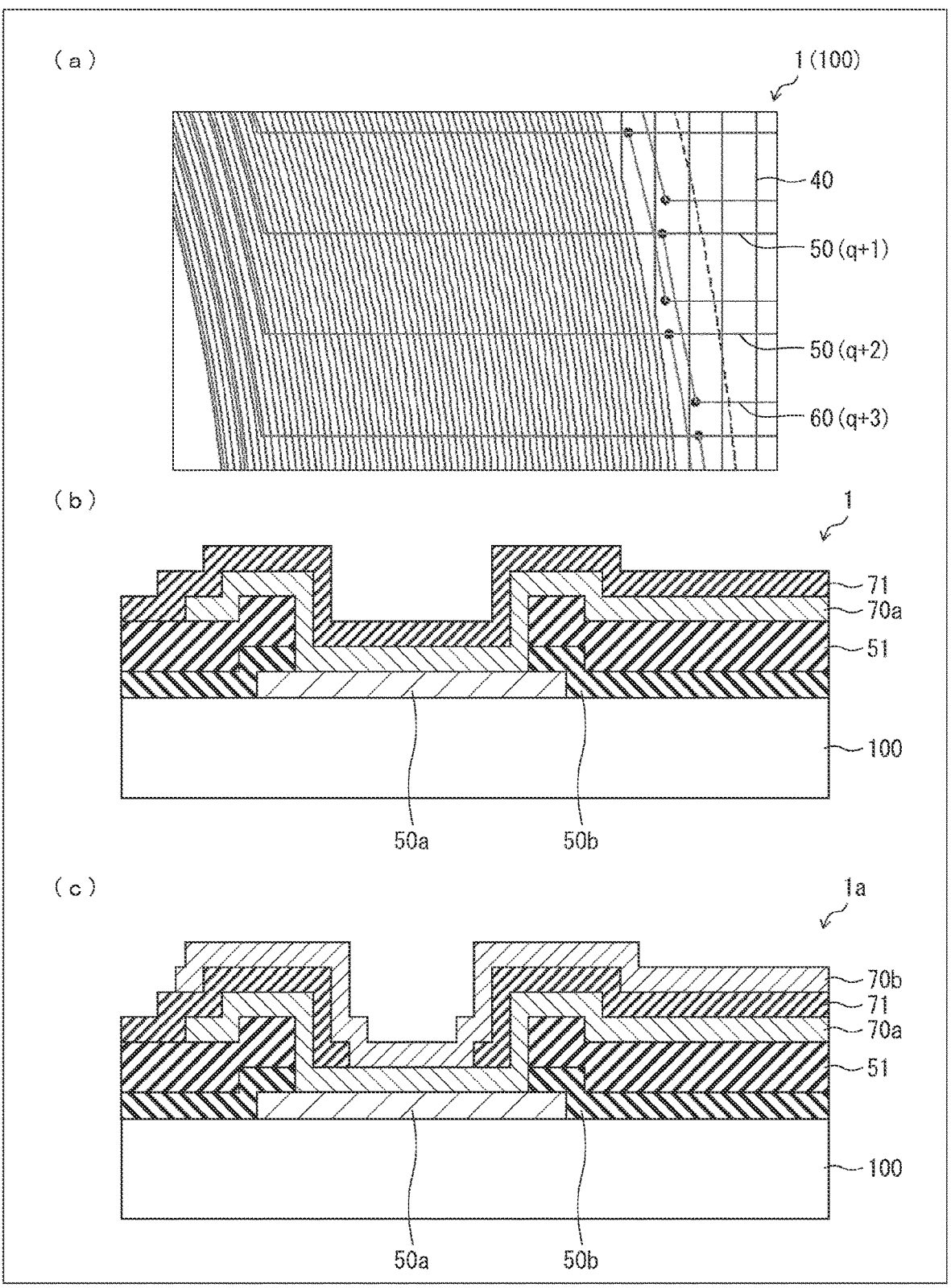

(a) of FIG. 8 is an enlarged view of part of (b) of FIG. 5.
(b) of FIG. 8 is a cross-sectional view of a connection section illustrated in (b) of FIG. 8. (c) of FIG. 8 is a cross-sectional view of a variation of the configuration illustrated in (b) of FIG. 8.

Figure 9:
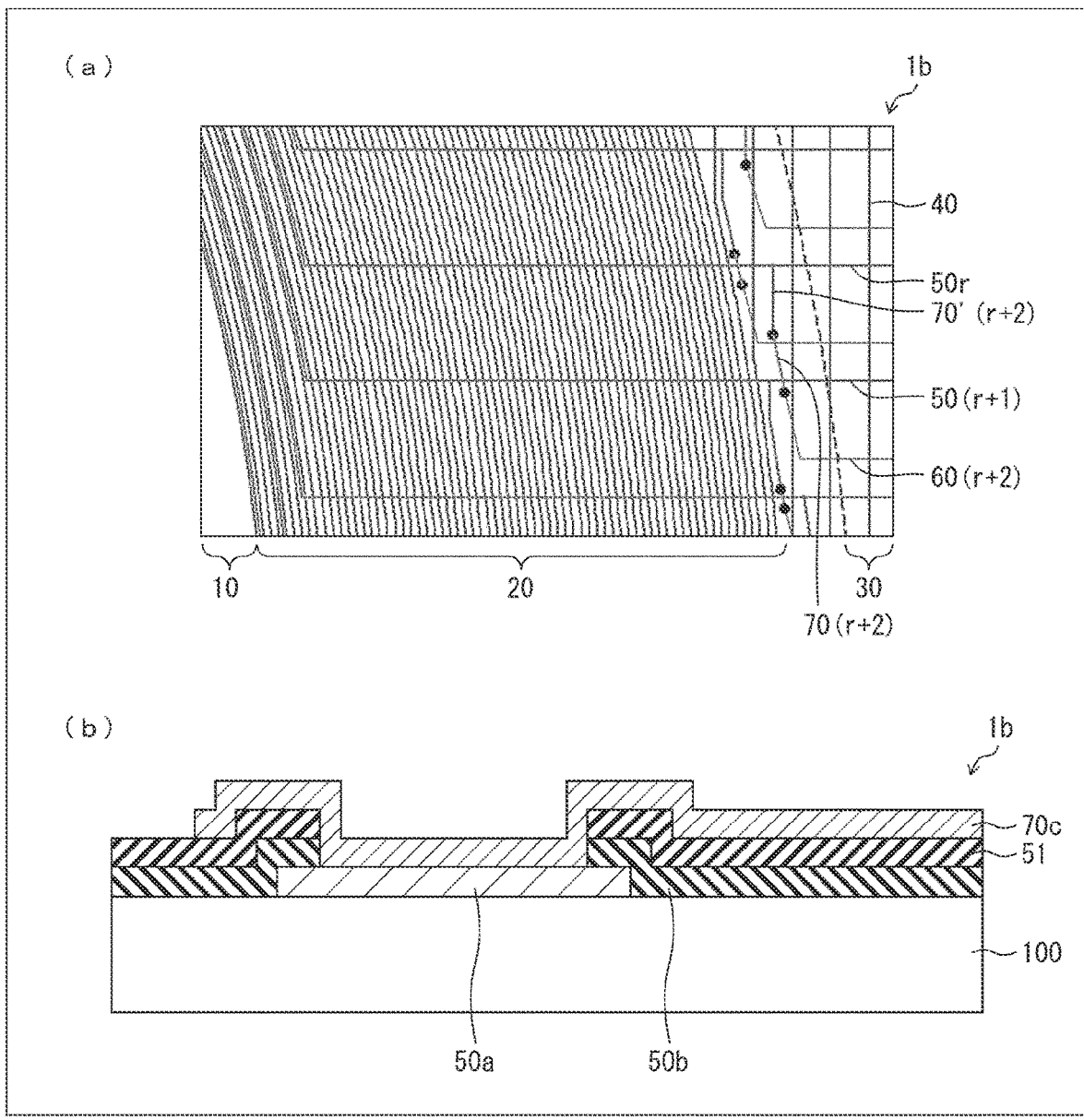

(a) of FIG. 9 is a diagram illustrating a variation of the configuration illustrated in (a) of FIG. 8. (b) of FIG. 9 is a cross-sectional view of a connection section illustrated in (a) of FIG. 9.

Figure 10:
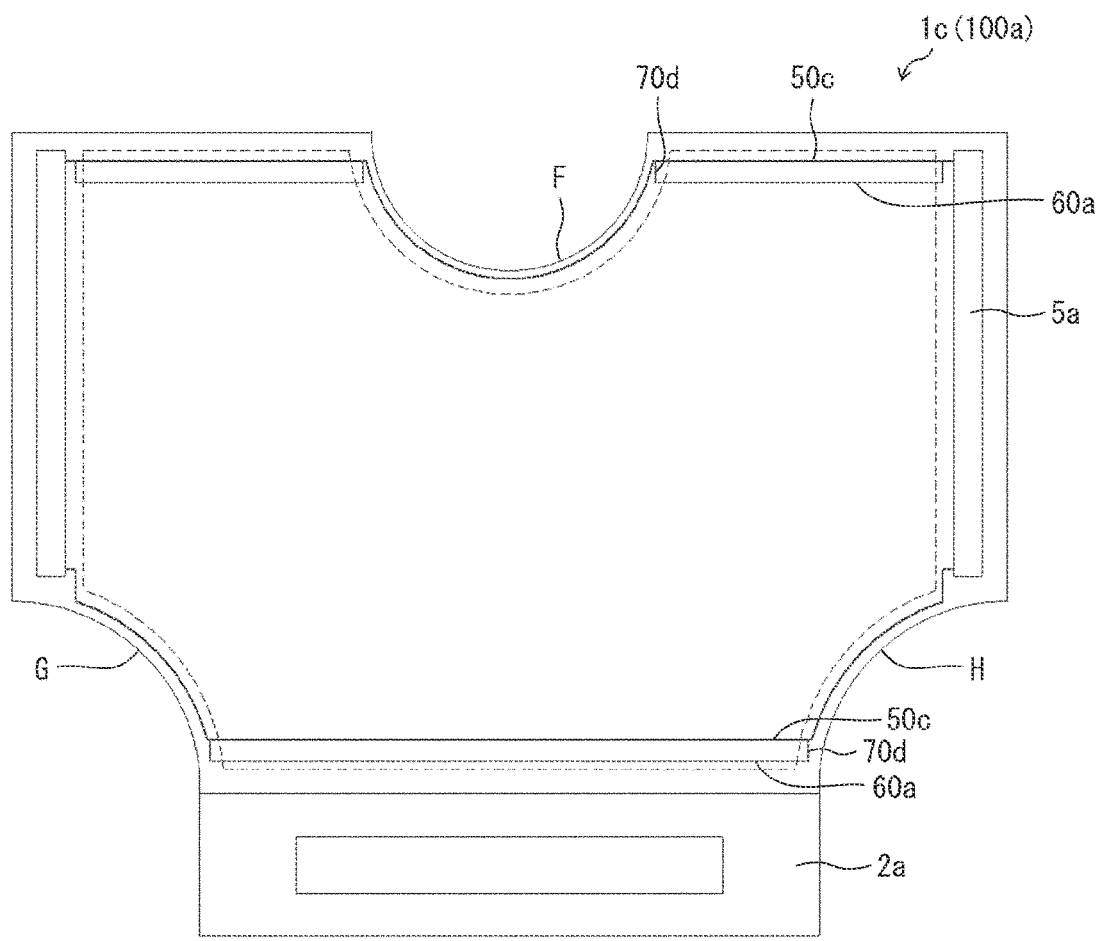

FIG. 10 is a diagram illustrating an overall configuration of variation of the liquid crystal display device in accordance with Embodiment 1.

Figure 11:
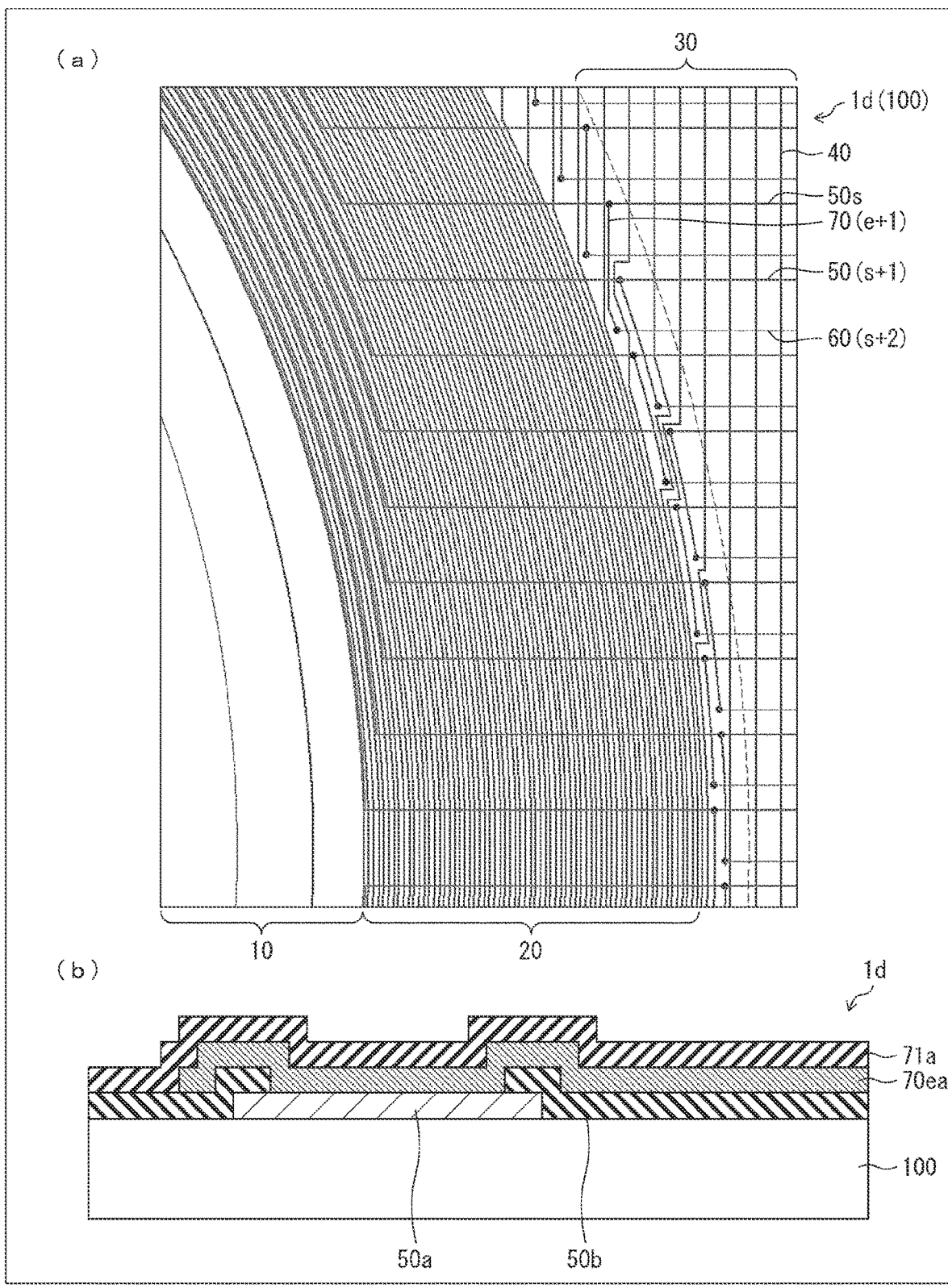

(a) of FIG. 11 is an enlarged view of a liquid crystal display device in accordance with Embodiment 2 of the present invention, and corresponds to section B of FIG. 2. (b) of FIG. 11 is a cross-sectional view of a connection section illustrated in (a) of FIG. 11.

Figure 12:
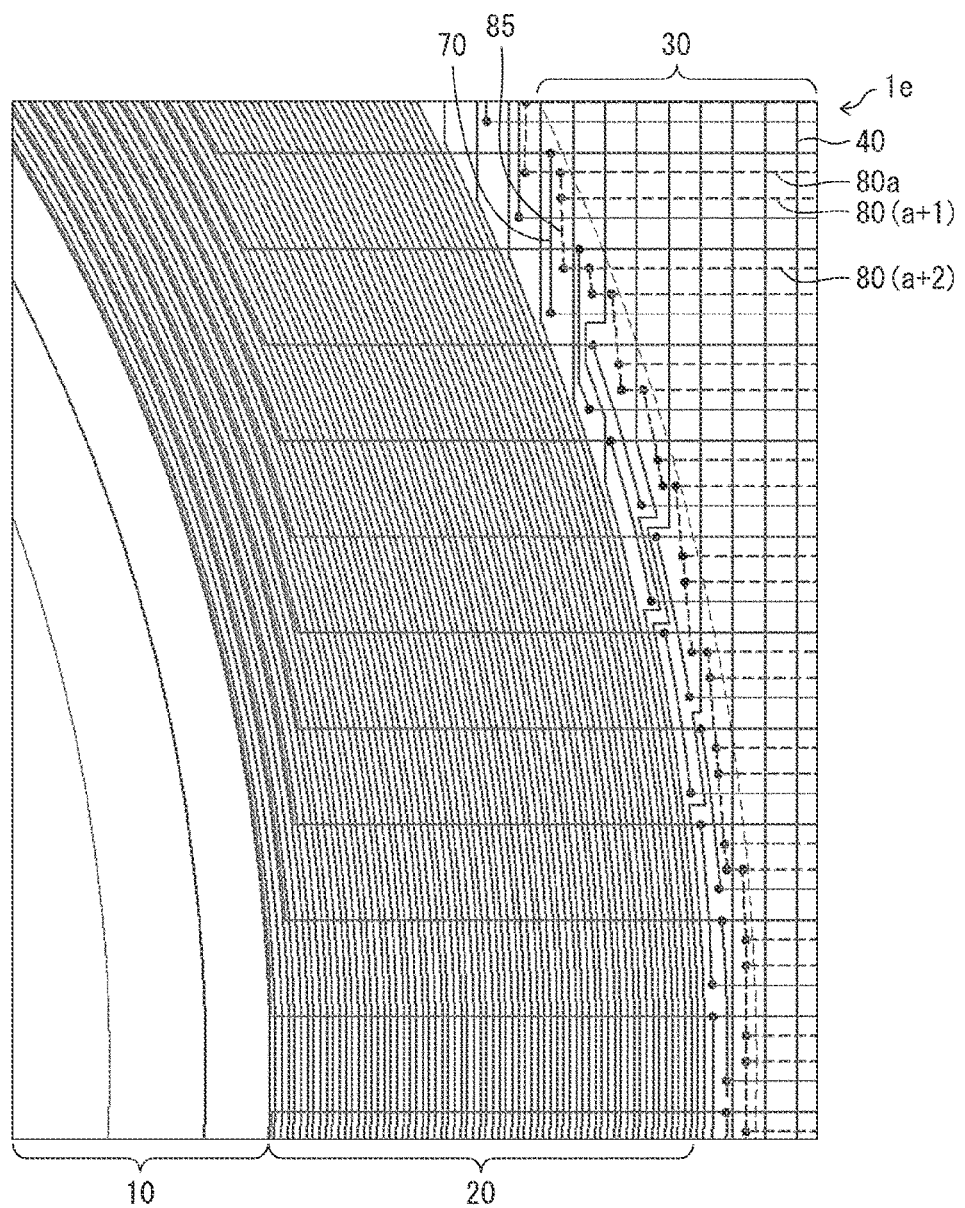

FIG. 12 is a diagram illustrating a variation of the liquid crystal display device in accordance with Embodiment 2, specifically, a variation of the configuration illustrated in (a) of FIG. 11.

Figure 13:
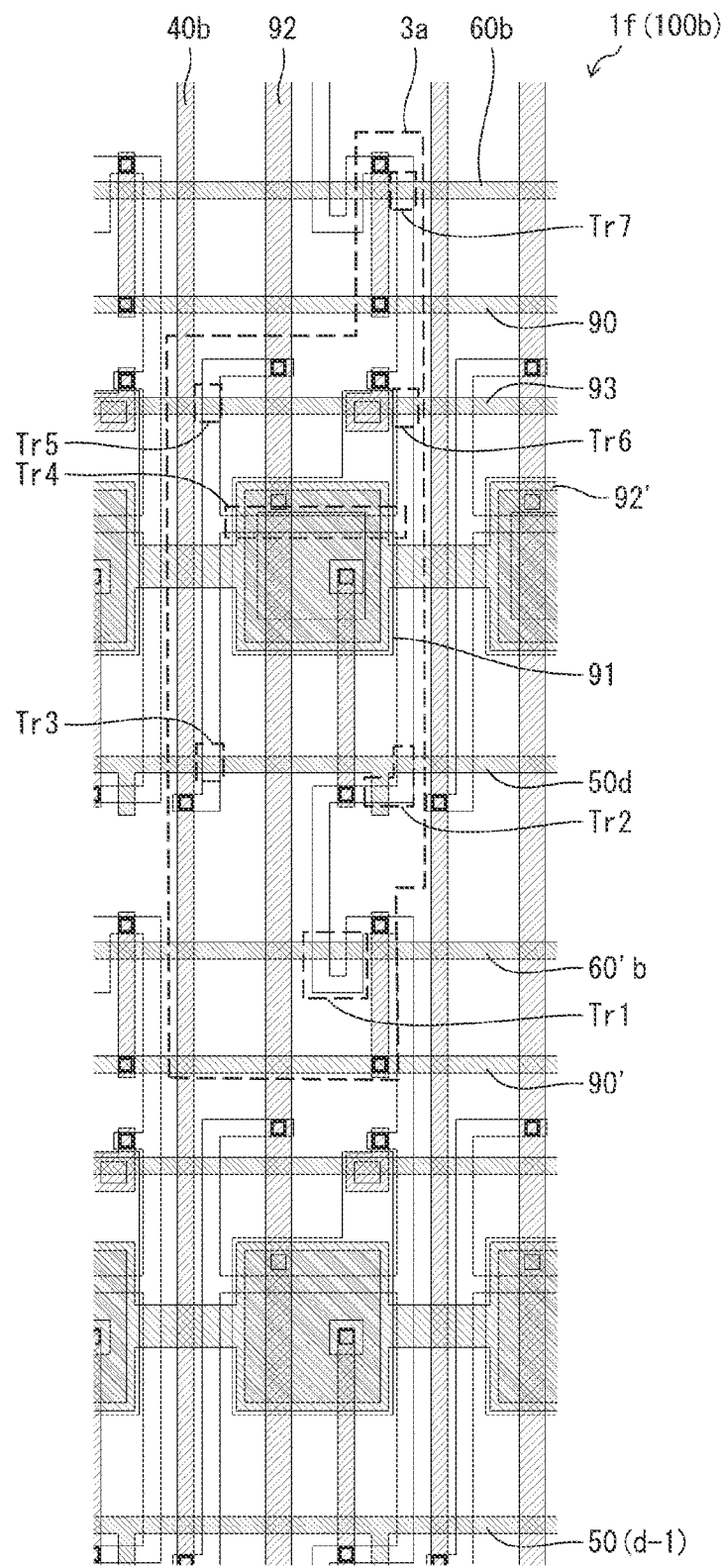

FIG. 13 is a plan view illustrating a configuration of a substrate included in an organic EL display device in accordance with Embodiment 3 of the present invention.

Figure 14:
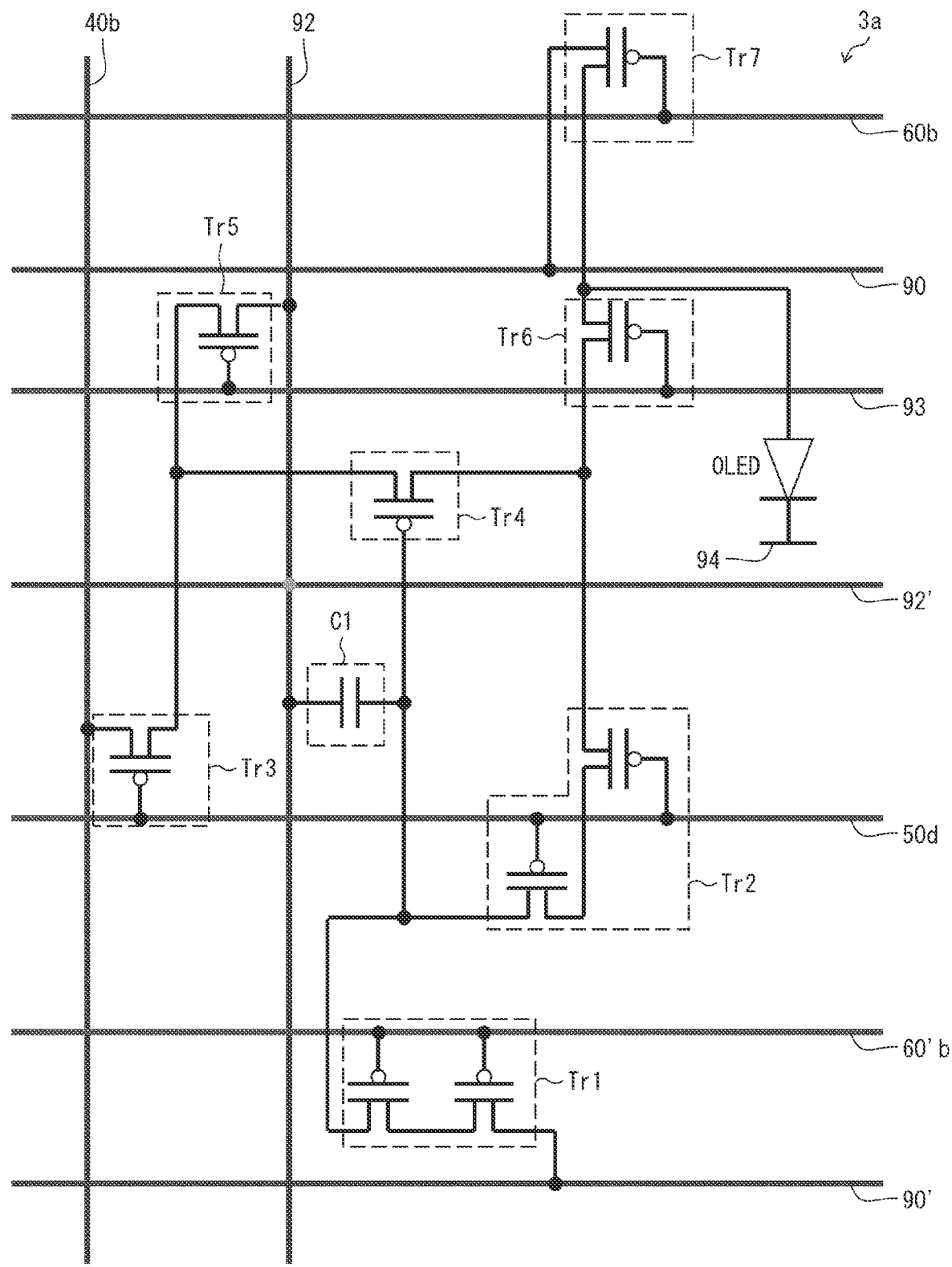

FIG. 14 is an example circuit diagram of a unit pixel in the configuration of FIG. 13.

(a) of FIG. 15 is an example cross-sectional view of a connection section of Embodiment 3. (b) of FIG. 15 is a cross-sectional view of a connection section in accordance with a variation of Embodiment 3. (c) of FIG. 15 is a cross-sectional view of a connection section in accordance with another variation of Embodiment 3.

DESCRIPTION OF EMBODIMENTS

Embodiment 1

The following description will discuss Embodiment 1 of the present invention, with reference to FIGS. 1 to 10. Note that although Embodiment 1 and Embodiment 2 (described later) discuss examples involving a liquid crystal display device, these examples are non-limiting. For example, the display device used may be an organic EL display device as described in Embodiment 3.

(Overall Configuration of Display Device)

The following description will discuss, with reference to FIG. 2, an overall configuration of a liquid crystal display device in accordance with Embodiment 1. FIG. 2 is a diagram illustrating an overall configuration of a liquid crystal display device 1 in accordance with Embodiment 1. As illustrated in FIG. 2, the liquid crystal display device 1 includes a substrate (array substrate) 100 such as a glass substrate, an opposing substrate provided so as to oppose the substrate 100 with a predetermined distance therebetween, and a liquid crystal layer sealed between the substrate 100 and the opposing substrate. The liquid crystal display panel 1 has a displaying region 30 and a non-displaying region 10. The non-displaying region 10 is substantially circular in shape and is surrounded by the displaying region 30. The substrate 100 has a substantially circular cutout section which overlaps with all of, or at least part of, the non-displaying region 10. In FIG. 2, the reference sign 2 is used to indicate a flexible printed circuit board for connection to an external control means (not illustrated). The reference sign 40 indicates source lines (also called "data lines"). The reference sign 50 (60) indicates gate lines (sub gate lines). The gate lines (sub gate lines) may also be called scanning lines. The reference sign 4 indicates a source driving section which provides a data signal to the source lines 40. The reference sign 5 indicates a gate driving section which provides a scan signal to the gate lines 50 (60).

The liquid crystal display device in accordance with Embodiment employs, for example, a vertical alignment mode. The liquid crystal display device has multi-pixels, in which at least two pixel electrodes are provided for a single pixel. A voltage is applied between (i) each one of these pixel electrodes and (ii) for example, the counter electrode 3-3 illustrated in FIG. 4. The voltage differs between each one of the pixel electrodes. Counter electrodes are provided, for example, on the opposing substrate.

Figure 4:
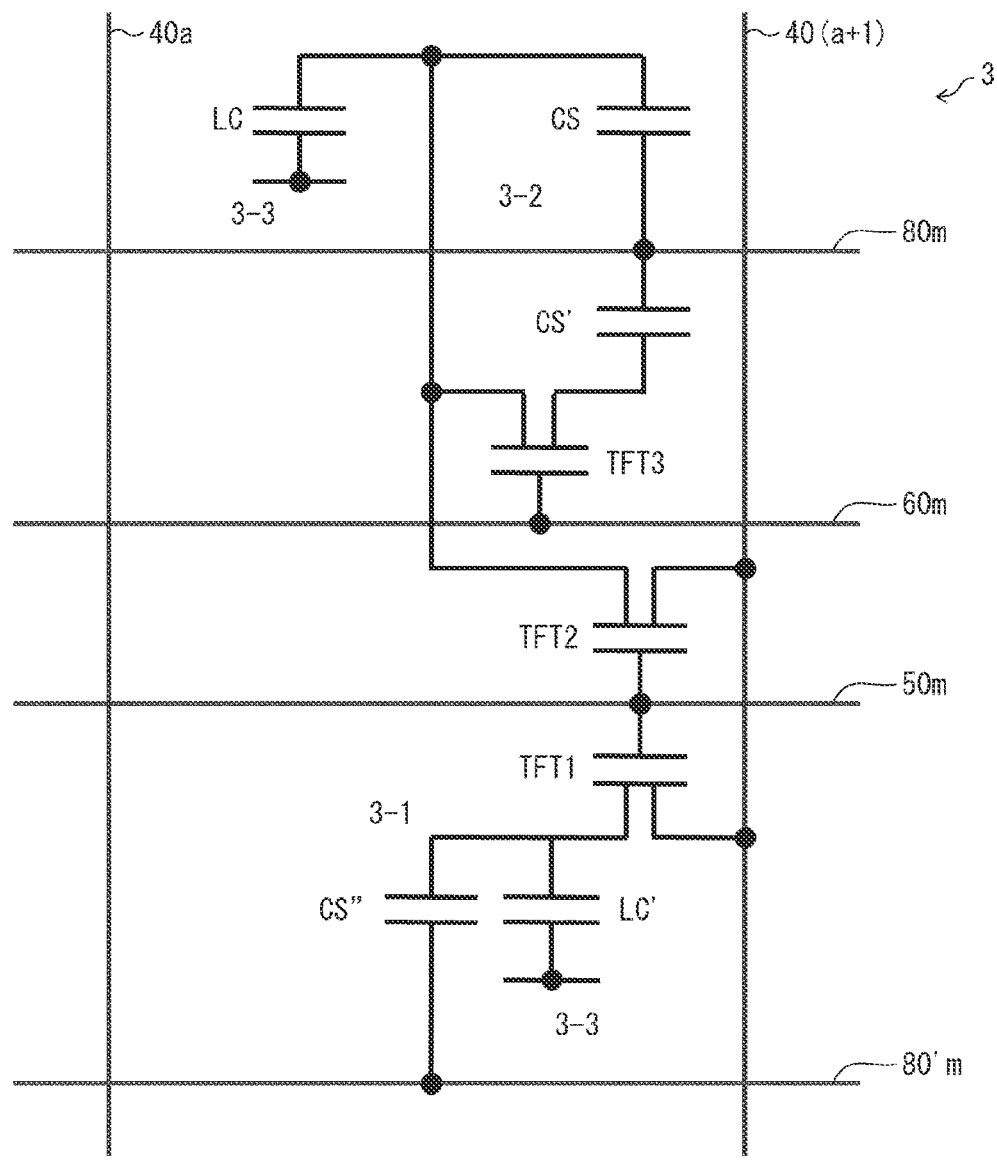
FIG. 4 is an example circuit diagram of a unit pixel in the configuration of FIG. 3.

Multi-pixels make it possible to improve a viewing angle characteristic and can be realized by a variety of methods. In Embodiment 1, as one example, each pixel is configured so as to further include (i) two switching elements connected to a shared gate line, (ii) one switching element connected to a sub gate line, and (iii) three storage capacitors connected to respective storage capacitor lines, as illustrated in FIG. 4 (described later).

In Embodiment 1, each pixel includes a sub gate line. Specifically, the sub gate line is supplied with a signal that is identical to a signal supplied to one gate line, out of a plurality of gate lines, which one gate line is in a pixel row differing from the row of the pixel to which the sub gate line is connected (for example, a gate line of a pixel row located two rows down).

As illustrated in FIG. 2, a wiring diverting region 20 is provided between the displaying region 30 and the non-displaying region 10 of the substrate 100.

Note that although the presently discussed example involves a configuration in which the substrate 100 includes a cutout section in the non-displaying region 10, it is not essential for the substrate 100 to have such a cutout section. For example, even in a configuration where the substrate 100 is present in the non-displaying region 10, the transmittance of the non-displaying region 10 can be improved by providing the wiring diverting region 20 peripherally to the non-displaying region 10, such that no wiring is present in the non-displaying region 10. Such a configuration is suitable for a game machine in which, for example, a backlight is not provided behind the non-displaying region 10, and instead, a drum (reel) for a slot machine is provided.

(Configuration of Main Parts of Liquid Crystal Display Device)

Figure 1:
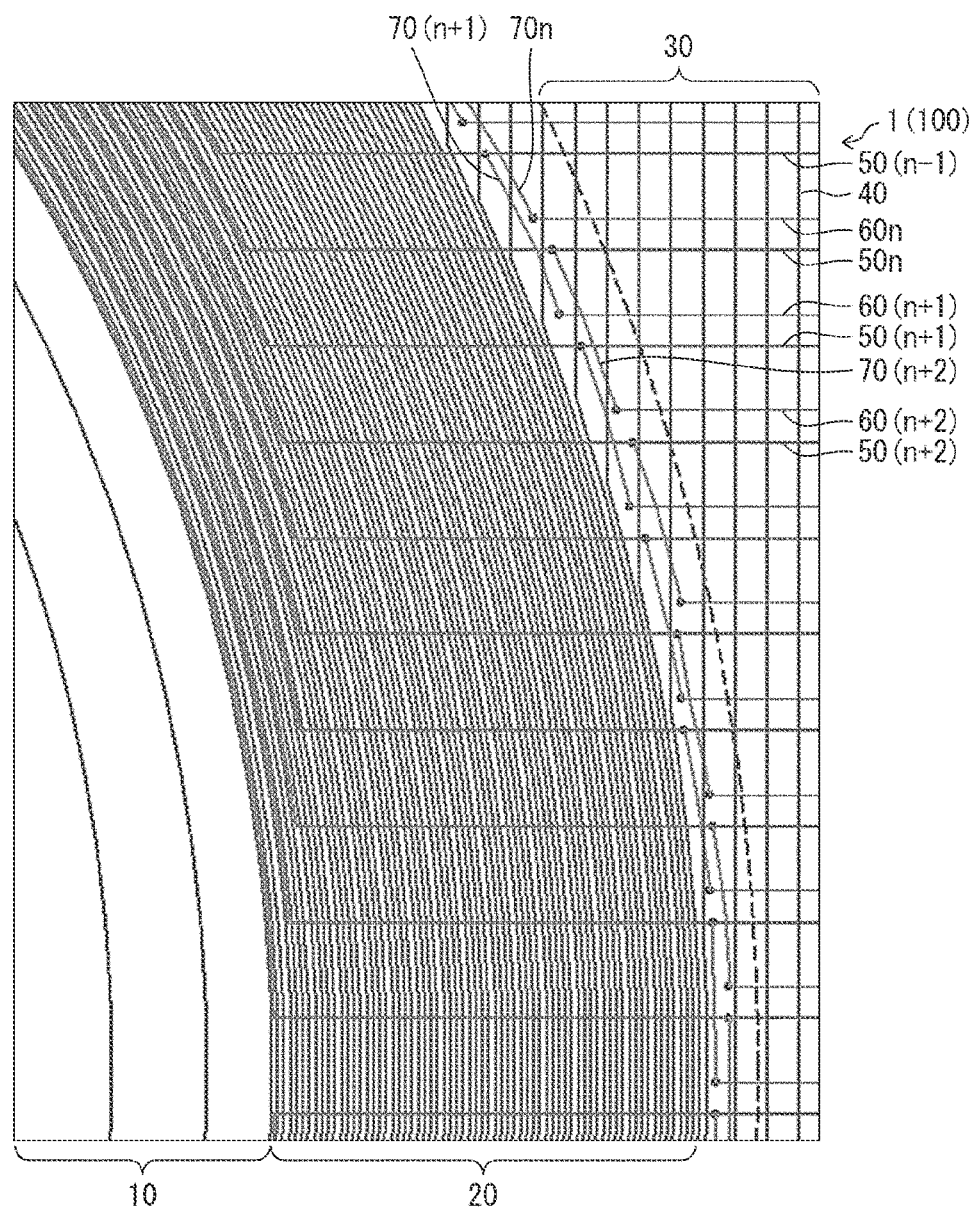
FIG. 1 is an enlarged view of a portion of liquid crystal display device in accordance with Embodiment 1 of the present invention.

With reference to FIGS. 1, 3, and 4, the following description will discuss a configuration of main parts of the liquid crystal display device 1 in detail. FIG. 1 is an enlarged view of a portion of the liquid crystal display device 1 in accordance with Embodiment 1. FIG. 1 illustrates a configuration of main parts of the liquid crystal display device 1. As illustrated in FIG. 1, a plurality of gate lines 50 and sub gate lines 60, and a plurality of source lines 40 are provided in a grid-like manner in the displaying region 30 of the liquid crystal display device 1. Though not illustrated in FIG. 1, other members such as pixel transistors and pixel electrodes are also provided in the displaying region 30.

Specifically, in the displaying region 30, the plurality of source lines 40 are provided so as to extend in a vertical direction, whereas the plurality of gate lines 50 and the plurality of sub gate lines 60 are provided so as to extend in a horizontal direction.

In the following descriptions, the total number of gate lines (including sub gate lines) is represented as "N" (where N is a natural number). Furthermore, the letters n, m, p, q, r, and s are used to indicate an individual line number and represent natural numbers less than or equal to N.

As illustrated in FIG. 1, the sub gate lines 60 and the gate lines 50 are provided in an alternating manner, in the following order: 60n (where "n" is a natural number; the same applies hereinafter), 50n, 60(n+1), 50(n+1), 60(n+2), 50(n+2), etc. In the displaying region 30 of the liquid crystal display device 1, for example, the sub gate line 60(n+2) and the gate line 50(n+2) are provided in the same pixel row. Of these two lines, the sub gate line 60(n+2) is connected to the gate line 50n, which is in a different row from the gate line 50(n+2), via a connecting line 70(n+2), the connection skipping the gate line 50(n+1). The sub gate line 60(n+2) and the gate line 50n receive the same signal. Similarly, the sub gate line 60(n+1) is connected to a gate line 50(n−1) via a connecting line 70(n+1), the gate line 50(n−1) being the next gate line after skipping the gate line 50n. A similar configuration is repeated throughout a region between the wiring diverting region 20 and the displaying region 30 of the liquid crystal display device 1.

FIG. 3 is an enlarged view of section A of FIG. 2. In FIG. 3 as well, for example, a sub gate line 60(m+2) is connected to a gate line 50m via a connecting line 70(m+2), the connection skipping a gate line 50(m+1). That is to say, the configuration illustrated in FIG. 3 is similar to that of FIG. 1.

FIG. 4 is an example circuit diagram of one of a plurality of unit pixels 3 included in the liquid crystal display device 1. As illustrated in FIG. 4, each of the unit pixels 3 includes (i) in a main pixel 3-1, two switching elements (TFT1, TFT2) connected to the gate line 50m, and (ii) in a sub-pixel 3-2, a switching element (TFT3) connected to a sub gate line 60m. Possible examples of these switching elements include, but are not limited to, an oxide semiconductor n-type thin film transistor (TFT).

In this way, the liquid crystal display device 1 of Embodiment includes: the substrate 100 having the displaying region 30 and the non-displaying region 10; a plurality of first switching elements TFT1 and TFT2; a plurality of gate lines 50 each of which is respectively connected to a gate of one or more of the plurality of first switching elements TFT1 and TFT2; a plurality of second switching elements TFT3; a plurality of sub gate lines 60 each of which is respectively connected to a gate of one or more of the plurality of second switching elements TFT3; and one or more connecting lines 70, each of which connects a respective one of the plurality of gate lines 50 to a respective one of the plurality of sub gate lines 60.

With the above configuration, in a region between the displaying region 30 and the wiring diverting region 20, connecting lines 70 connect respective ones of the plurality of gate lines 50 to respective ones of the plurality of sub gate lines 60. It is therefore possible to reduce, in the wiring diverting region 20 (described later), the number of diverting wires corresponding to the sub gate lines 60. This makes it possible to reduce the area of the wiring diverting region 20. This also makes it possible to reliably cure a sealing material provided peripherally to the non-displaying region and provide a liquid crystal display device having a decreased bezel size.

As illustrated in FIG. 4, each of the unit pixels 3 includes (i) in the sub-pixel 3-2, a storage capacitor CS and storage capacitor CS' which are each connected to a storage capacitor line 80m, and (ii) in the main pixel, a storage capacitor CS" connected to a storage capacitor line 80'm. As illustrated in FIG. 4, each of the unit pixels 3 includes, in the sub-pixel, a liquid crystal capacitor LC connected in parallel to the storage capacitor CS. As illustrated in FIG. 4, each of the unit pixels 3 includes, in the main pixel, a liquid crystal capacitor LC' connected in parallel to the storage capacitor CS".

Next, with reference to FIG. 5, the following description will further discuss a configuration of main parts of the liquid crystal display device 1. (a) of FIG. 5 is an enlarged view of section C of FIG. 2. (b) of FIG. 5 is an enlarged view of section B of FIG. 2. Because the configurations illustrated in (a) of FIG. 5 and (b) of FIG. 5 have line symmetry, explanation will be provided for only one of these configurations. As illustrated in FIG. 5, the substrate 100 of the liquid crystal display device 1 includes the wiring diverting region 20, which is provided between the displaying region 30 and the non-displaying region 10. No sub gate lines 60 are provided in the wiring diverting region 20.

With the above configuration, because there are no sub gate lines 60 in the wiring diverting region 20, it is possible to avoid providing, in the wiring diverting region 20, diverting wires corresponding to the sub gate lines.

As described above, the liquid crystal display device 1 includes a plurality of source lines 40. Furthermore, in Embodiment 1, though not illustrated in detail, a layer in which the connecting lines 70 are provided differs from both (i) a layer in which the gate lines 50 are provided and (ii) a layer in which the source lines 40 are provided.

With the above configuration, providing the connecting lines in a layer which differs from both (i) the layer in which the gate lines are provided and (ii) the layer in which the source lines are provided makes it possible to effectively prevent defects such as short circuits between wires.

Next, with reference to FIG. 6, the following description will further discuss a configuration of main parts of the liquid crystal display device 1. (a) of FIG. 6 is an enlarged view of section E of FIG. 3. (b) of FIG. 6 is a diagram illustrating a comparative example. In contrast to a configuration in which no sub gate lines 60 are provided in the wiring diverting region 20 (as illustrated in (a) of FIG. 6), the configuration of the comparative example shown in (b) of FIG. 6 involves diverting both gate lines and sub gate lines. As such, compared to the configuration of (a) of FIG. 6, the configuration of (b) of FIG. 6 has a greater number of wires in the wiring diverting region 20. Therefore, in comparison to the configuration of the comparative example illustrated in (b) of FIG. 6, the configuration in accordance with the present application as illustrated in (a) of FIG. 6 makes it possible to more reliably cure a sealing material provided peripherally to the non-displaying region and to decrease bezel size.

The above descriptions explained a central portion of the displaying region 30. Next, with reference to FIG. 7, the following description will discuss a peripheral portion of the displaying region 30. FIG. 7 is an enlarged view of section D of FIG. 2. As illustrated in FIG. 7, on a side toward the gate driving section 5, a sub gate line 60(p+2) is connected to a gate line 50p, the connection skipping a gate line 50(p+1), similarly to the corresponding configuration in the central part of the displaying region 30.

Next, with reference to FIGS. 8 and 9, the following description will further discuss a configuration of main parts of the liquid crystal display device 1. (a) of FIG. 8 is an enlarged view of part of (b) of FIG. 5, (b) of FIG. 8 is a cross-sectional view of a connection section illustrated in (b) of FIG. 8. (c) of FIG. 8 is a cross-sectional view of a variation of the configuration illustrated in (b) of FIG. 8.

As illustrated in (a) of FIG. 8, a sub gate line 60(q+3) is connected to a gate line 50(q+1), the connection skipping a gate line 50(q+2).

As illustrated in (b) of FIG. 8, the liquid crystal display device 1 includes a gate electrode layer 50a, which is provided on the substrate 100 and includes the gate lines 50.

Above the gate electrode layer 50a, a gate insulating film 50b and a first insulating film 51 are provided in this order in a manner so as to cover the gate electrode layer 50a. A contact hole (an opening) is formed in the gate insulating film 50b and the first insulating film 51 at a position corresponding to the gate electrode layer 50a. A connecting line layer 70a, in which the connecting lines 70 are provided, is provided so as to cover a portion of the gate insulating film 50b and the first insulating film which portion includes the contact hole. Finally, a second insulating film 71 is provided above the connecting line layer 70a so as to cover the connecting line layer 70a. The above configuration makes it possible to achieve an electrical connection between the connecting line layer 70a and the gate electrode layer 50a.

The gate electrode layer 50a is a conductive layer. Examples of possible materials for the gate electrode layer 50a include metallic materials such as titanium (Ti), copper (Cu), chromium (Cr), aluminum (Al), gold (Au), molybdenum (Mo), tungsten (W), an alloy of any of these, and a laminated film including any of these. In Embodiment 1, the gate electrode layer 50a is preferably configured to have a two-layered structure including layer of copper (Cu) and a layer of titanium (Ti).

Examples of possible materials for the gate insulating film 50b include inorganic insulating materials such as silicon dioxide ($SiO_2$) and silicon nitride ($SiN_x$). Examples of possible materials for the first insulating film 51 include organic insulating materials such as acrylic resin containing a photosensitizer. Alternatively, inorganic insulating materials such as silicon dioxide ($SiO_2$) and silicon nitride ($SiN_x$) can be used, similarly to the gate insulating film 50b. The first insulating film 51 may have, for example, a two-layered structure in which an organic insulating material is provided above silicon dioxide ($SiO_2$).

Examples of possible materials for the connecting line layer 70a include titanium (Ti), copper (Cu), aluminum (Al), ITO (transparent conductive film), and a laminated film including any of these. Examples of possible materials for the second insulating film 71 include inorganic insulating materials such as silicon nitride ($SiN_x$)

(c) of FIG. 8 is a cross-sectional view of a variation of the configuration illustrated in (b) of FIG. 8. A liquid crystal display device 1a as illustrated in (c) of FIG. 8 differs from the configuration of (b) of FIG. 8 in that, in the liquid crystal display device 1a, a contact hole (opening) is formed in the second insulating film 71 at a position corresponding to the gate electrode layer 50a, and a second connecting line layer 70b is provided so as to cover a portion of the second insulating film 71 which portion includes the contact hole. The second connecting line layer 70b is made of, for example, a transparent conductive film such as ITO or IZO. The transparent conductive film may be configurationally similar to a conductive film constituting pixel electrodes in each pixel. Description is omitted here for members of the liquid crystal display device 1a which are similar to those of the configuration of (b) of FIG. 8.

(Variation of Connection Section)

(a) of FIG. 9 is a diagram illustrating a variation of the configuration illustrated in (a) of FIG. 8. (b) of FIG. 9 is a cross-sectional view of a connection section illustrated in (a) of FIG. 9. As illustrated in (a) of FIG. 9, a sub gate line 60(r+2) is connected to a gate line 50r via a connecting line 70(r+2) and a branch wire 70'(r+2), the connection skipping a gate line 50(r+1).

(b) of FIG. 9 differs from (b) of FIG. 8 with regards to the following points (1) and (2). (1) In (b) of FIG. 9, the connecting line layer 70a of (b) of FIG. 8 is replaced by a connecting line layer 70c made of a transparent conductive film such as ITO or IZO. (2) In (b) of FIG. 9, the second insulating film 71 of (b) of FIG. 8 has been omitted. Description is omitted here for members which are similar between these two configurations. The above configuration makes it possible to decrease production costs by employing the same type of conductive film for both the transparent conductive film and the pixel electrodes.

(Variation of Liquid Crystal Display Device)

Discussed above were examples in which a circular non-displaying region was provided in the center of a liquid crystal display device. The present invention is not, however, limited to such examples. For example, the non-displaying region may be provided in a peripheral portion of a liquid crystal panel. In other words, it is not essential for the non-displaying region to be completely surrounded by the displaying region. It is possible to employ a configuration in which the displaying region exists peripherally to at least a part of a perimeter of the non-displaying region. Furthermore, the non-displaying region may have a rectangular shape or some other shape.

FIG. 10 is a diagram illustrating an overall configuration of a variation of the liquid crystal display device in accordance with Embodiment 1. As illustrated in FIG. 10, the present invention may be applied even to a configuration in which, for example, a non-displaying region is formed so as to be in contact with a side of a mostly rectangular contour (displaying region) (see section F in FIG. 10) and/or a non-displaying region is formed in a corner of the mostly rectangular contour (see sections G and H in FIG. 10).

Specifically, a liquid crystal display device 1c as illustrated in FIG. 10 is configured such that gate lines 50c are connected to sub gate lines 60a via connecting lines 70d.

With the above configuration, it is possible to avoid providing diverting wires corresponding to sub gate lines in wiring diverting regions such as those of sections F, G, and H as illustrated in FIG. 10. This makes it possible to reliably cure a sealing material provided peripherally to the non-displaying regions and provide a liquid crystal display device having a decreased bezel size.

Discussed above in Embodiment 1 was an example in which a method of inputting the same signal to a gate line and a sub gate line involved connecting gate lines to corresponding ones of the sub gate lines via a source layer, on a side toward the gate driving section 5 (see FIG. 7). Note, however, that this example is non-limiting. For example, a configuration may be employed in which the same signal is supplied from differing signal sources. It is also possible to employ a configuration in which the gate driving section 5 is not provided monolithically on the substrate 100 but is rather mounted as a driver chip.

Furthermore, with regard to the display mode of the liquid crystal display device, the liquid crystal display device can be, but is not limited to, a VA mode liquid crystal display device. It is also possible to employ a liquid crystal display device of some other mode, such as a TN mode liquid crystal display device or FFS mode liquid crystal display device.

Furthermore, it is assumed that bottom-gate type oxide semiconductor TFTs are used as switching elements for the pixels. Note, however that the switching element used may be, for example, an a-si TFT, a p-Si TFT, a top-gate type TFT, an n-type TFT, and a p-type TFT.

The size and shape of the displaying region can be altered as appropriate.

Furthermore, although Embodiment 1 involved an example in which diverting wires in a wiring diverting region are provided in the form of evenly-spaced wires which form concentric circular arcs, this is merely a non-limiting example for illustrating differences in contrast to a comparative example ((b) of FIG. 6).

Embodiment 2

A configuration of Embodiment 2 differs from that of Embodiment 1 mainly in regard to the layer in which the connecting lines are formed. The following description will focus mainly on this difference.

The following description will discuss Embodiment 2 of the present invention, with reference to FIGS. 11 and 12. In Embodiment 2, any members similar to those in Embodiment 1 will be given the same reference sign, and descriptions thereof will be omitted unless necessary.

(Configuration of liquid crystal display device 1d)

(a) of FIG. 11 is an enlarged view of a liquid crystal display device 1d in accordance with Embodiment 2, and corresponds to section B of FIG. 2. (b) of FIG. 11 is a cross-sectional view of a connection section illustrated in (a) of FIG. 11. As illustrated in (a) of FIG. 11, a sub gate line 60(s+2) is connected to a gate line 50s via a connecting line 70(e+1) the connection skipping a gate line 50(s+1). The connecting line 70(e+1) is provided in a layer in which source lines 40 are provided. The same signal is supplied to the sub gate line 60(s+2) and the gate line 50s.

As illustrated in (b) of FIG. 11, the liquid crystal display device 1d includes a gate electrode layer 50a which is provided on the substrate 100 and which contains the gate lines 50. A gate insulating film 50b is provided above the gate electrode layer 50a so as to cover the gate electrode layer 50a. A contact hole (opening) is formed in the gate insulating film 50b at a position corresponding to the gate electrode layer 50a. A connecting line layer 70ea (layer including source lines 40), in which the connecting lines 70 are provided, is provided so as to cover a portion of the gate insulating film 50b which portion includes the contact hole. Finally, a first insulating film 71a is provided above the connecting line layer 70ea so as to cover the connecting line layer 70ea. The above configuration makes it possible to achieve an electrical connection between the connecting line layer 70ea and the gate electrode layer 50a.

Examples of possible materials for the connecting line layer 70ea include metallic materials such as titanium (Ti), copper (Cu), chromium (Cr), aluminum (Al), gold (Au), molybdenum (Mo), tungsten (W), an alloy of any of these, and a laminated film including any of these.

Examples of possible materials for the gate electrode layer 50a, the gate insulating film 50b, and the first insulating film 71a are as described with respect to corresponding members of Embodiment 1, and a description of such is therefore omitted here.

In Embodiment 1, the connecting line layer differed from the gate layer and the source layer (i.e., the connecting line layer was provided in the same layer as (i) an electrode layer which formed storage capacitors by overlapping with pixel electrodes, with an insulating film sandwiched therebetween, or (ii) a wiring layer for reducing resistance of the electrode layer which forms storage capacitors). In Embodiment 2, the connecting line layer is provided in the same layer as a source layer. This configuration, too, makes it possible achieve an effect similar to that of Embodiment 1. In particular, with the above configuration, there is no need to add a wiring layer or an insulating film in a case where storage capacitors are formed without the use of an electrode layer that forms the storage capacitors (for example, in a case where a majority of storage capacitors are formed by pixel electrodes and storage capacitor lines provided in the same layer as a gate layer). As such, the above configuration is suitable in terms of avoiding an increase in production costs.

Next, with reference to FIG. 12, the following description will discuss a configuration of main parts of a liquid crystal display device 1e in accordance with a variation of Embodiment 2. As illustrated in FIG. 12, the liquid crystal display device 1e further includes a plurality of storage capacitor lines 80a, 80(a+1), 80(a+2), etc., provided in a gate layer. The plurality of storage capacitor lines 80a, 80(a+1), 80(a+2), etc. are connected to each other via common connecting lines 85 provided in a layer including the source lines 40.

The above configuration makes it possible to achieve an effect similar to that of Embodiment 1 even in a configuration having a plurality of storage capacitor lines provided in a gate layer. Furthermore, in comparison to a configuration in which a transparent conductive film such as ITO or IZO having high wire resistance is used for connecting lines, a configuration in which the connecting lines are provided in the source layer which is also the wiring layer in which common connecting lines are provided makes it possible reduce the resistance of the connecting lines without the need for an additional step. For example, even in a configuration in which the sub gate lines are connected to respective gate lines even further away, the above configuration makes it possible to provide connecting lines having low resistance.

As illustrated in FIG. 12, the common connecting lines 85 are positioned farther from the non-displaying region 10 than are the connecting lines.

In a configuration involving, for example, a large liquid crystal display device having common connecting lines for connecting storage capacitor lines, there are a large number of storage capacitor lines to be connected by the common connecting lines. As such, the common connecting lines tend to have a greater width than connecting lines for sub gate lines.

In considering the positional relationship between (i) connecting lines for sub gate lines and (ii) common connecting lines for storage capacitor lines, note that in a case where the common connecting lines for the storage capacitor line are positioned closer to the non-displaying region than are the connecting lines for the sub gate lines, the common connecting lines for the storage capacitor lines are brought closer to (and in some cases, may overlap with) a sealing region. Because these common connecting lines tend to be wide, such a configuration is disadvantageous in terms of reliably carrying out curing in the sealing region. Furthermore, in such a configuration, there are cases where it is necessary to provide openings in the common connecting line in order to cure the sealing material. A configuration in which common connecting lines are positioned farther from the non-displaying region than are the connecting lines therefore makes it possible to decrease the area of the wiring diverting region 20, which includes a region for providing the common connecting lines. This configuration also brings about the advantageous effect of allowing curing to be carried out reliably in the sealing region.

Embodiment 3

A configuration of Embodiment 3 differs from that of Embodiment 1 mainly in regard to the configuration of the switching elements and the substrate. The following description will focus mainly on this difference.

The following description will discuss Embodiment 3 of the present invention, with reference to FIGS. 13 to 15. In Embodiment 3, any members similar to those in Embodiment 1 will be given the same reference sign, and descriptions thereof will be omitted unless necessary.

(Configuration of Organic EL Display Device 1f)

An organic EL display device 1f in accordance with Embodiment 3 is a top emission organic EL (organic light emitting diode, "OLED") display device which uses, for example, polysilicon p-type TFTs as switching elements for pixels. The organic EL display device 1f has a backplane substrate (corresponding to the substrate 100) which is flexible and contains, for example, polyimide.

FIG. 13 is a plan view illustrating a configuration of a substrate 100b included in the organic EL display device 1f in accordance with Embodiment 3. FIG. 14 is an example circuit diagram of one of a plurality of unit pixels 3a included in the organic EL display device 1f. As illustrated in FIGS. 13 and 14, each of the unit pixels 3a includes, for example:

- a set of switching elements (set of transistors 1, abbreviated as "Tr1"; similar abbreviation is used hereafter) connected to a sub gate line 60'b and an initialization power supply line 90';
- one set of switching elements (Tr2) connected to a gate line 50d, and another switching element (Tr3) connected to the gate line 50d;
- one switching element (Tr4) connected to a source line 40b via the Tr3;
- two switching elements (Tr5 and Tr6) connected to a signal line 93;
- one switching element (Tr7) connected to a sub gate line 60b;
- a capacitor C1 connected to (i) a gate of the Tr4 and (ii) anode-electrode-side power supply lines 92 and 92'; and
- an OLED device layer connected to the Tr6 and the Tr7.

Possible examples of these switching elements include, but are not limited to, a polysilicon p-type thin film transistor (TFT). The signal line 93 is supplied with a signal for controlling a light emitting period and non-light emitting period (writing period for gradation data) of the OLED device layer.

A signal supplied to the sub gate line 60b is the same as a signal supplied to the gate line 50d in the pixel row illustrated. The sub gate line 60b is connected to (i) the Tr7 in the pixel row illustrated and (ii) Tr1 in the subsequent pixel row.

Furthermore, a signal supplied to the sub gate line 60'b is the same as a signal supplied to a gate line 50(d−1) of the preceding pixel row. The sub gate line 60'b is a signal line which is supplied with a constant electric potential. The sub gate line 60'b controls the Tr1 and is for initializing the gate electrode electric potential of the Tr4 to be a constant electric potential (for example, the electric potential of an initialization power supply line 90').

The Tr4 is an element which controls the amount of current supplied to the OLED device layer. A first electrode selected from (i) the source electrode of Tr4 and (ii) the drain electrode of Tr4 is connected to a reflective electrode 91 via the Tr6. The reflective electrode is provided in a layer above the Tr4, and the OLED device layer is vapor deposited on the reflective electrode 91. The other one of (i) the source electrode of Tr4 and (ii) the drain electrode of Tr4 is connected to (a) the source line 40b via Tr3 and (b) power supply lines (anode-electrode-side power supply lines 92 and 92') via the Try, the power supply lines supplying power to the OLED device layer.

Note here that an initialization power supply line 90 is provided in a wiring layer (3rd wiring layer) which differs from both the gate layer and source layer, in a manner so as to extend parallel to the gate line 50d.

In other words, the 3rd wiring layer which includes the connecting lines also includes one or more power supply lines 90 to which an initialization voltage is applied.

The anode-electrode-side power supply line 92 is provided in the source layer so as to run parallel to the source line 40b. The anode-electrode-side power supply line 92' is provided in the 3rd wiring layer so as to run parallel to the gate line 50d. The anode-electrode-side power supply line 92 and the anode-electrode-side power supply line 92' are connected to each other.

The above configuration makes it possible to improve the degree of freedom in designing the substrate of the organic EL display device 1f, without increasing production costs.

The reflective electrode 91 is an anode electrode of the OLED device. Embodiment 3 includes a reflective electrode layer which includes the reflective electrode 91. The connecting lines are provided in this reflective electrode layer. This makes it possible to improve display brightness.

With reference to FIG. 15, the following description will discuss a cross-sectional configuration of a connection section in Embodiment 3. (a) of FIG. 15 is an example cross-sectional view of a connection section of Embodiment 3. (b) of FIG. 15 is a cross-sectional view of a connection section in accordance with a variation of Embodiment 3. (c) of FIG. 15 is a cross-sectional view of a connection section in accordance with another variation of Embodiment 3.

As illustrated in FIG. 15, members that are common across the cross-sectional configurations of connection sections in Embodiment 3 and its variations are: the substrate 100b, a base coat film 101, a gate insulating film 50db, a gate electrode layer 50da, and a first insulating film 51a.

As illustrated in (a) of FIG. 15, a contact hole (opening) is formed in the first insulating film 51a at a position corresponding to the gate electrode layer 50da. A 3rd wiring layer 70f, in which the connecting lines 70 are provided, is provided so as to cover a portion of the first insulating film 51a which portion includes the contact hole. A second insulating film 71b, a planarizing film 72, and a barrier film 73 are provided in this order above the 3rd wiring layer 70f, in a manner so as to cover the 3rd wiring layer 70f. The above configuration makes it possible to achieve an electrical connection between the 3rd wiring layer 70f, which is a connecting line layer, and the gate electrode layer 50da.

Examples of possible materials for the substrate 100b, the base coat film 101, the gate insulating film 50db, the gate electrode layer 50da, the first insulating film 51a, and the second insulating film 71b are as described with respect to corresponding members of foregoing embodiments, and a description of such is therefore omitted here.

Examples of possible materials for the gate electrode layer 50da and the 3rd wiring layer 70f include metallic materials such as molybdenum (Mo), titanium (Ti), copper (Cu), chromium (Cr), aluminum (Al), gold (Au), tungsten (W), an alloy of any of these, and a laminated film including any of these. In Embodiment 3, the gate electrode layer 50da and the 3rd wiring layer 70f are preferably made of molybdenum (Mo).

Conventional materials such as polyimide can be used for the planarizing film 72 and the barrier film 73. As such, a detailed description of materials for these members is omitted here.

One example of a variation of the above configuration is illustrated in (b) of FIG. 15. The following description will discuss only differences from (a) of FIG. 15. Description of similarly configured members is omitted. As illustrated in (b) of FIG. 15, the second insulating film 71*b* and the planarizing film 72 are provided, in this order, in a manner so as to cover the first insulating film 51*a*. A contact hole (opening) is formed in the first insulating film 51*a*, the second insulating film 71*b*, and the planarizing film 72 at a position corresponding to the gate electrode layer 50*da*. A reflective electrode layer 91*a*, in which the connecting lines 70 are provided, is provided so as to cover a portion of the planarizing film 72 which portion includes the contact hole. The barrier film 73 is provided in a manner so as to cover the reflective electrode layer 91*a*. The above configuration makes it possible to achieve an electrical connection between the reflective electrode layer 91*a*, which is a connecting line layer, and the gate electrode layer 50*da*.

The above configuration also makes it possible to form the reflective electrode layer 91*a* from, for example, a metal having excellent reflectivity and conductivity, such as silver (Ag), or from a laminated film containing, for example, a metal and ITO.

Another variation of the above configuration is illustrated in (c) of FIG. 15. The following description will discuss only differences from (a) and (b) of FIG. 15. Description of similarly configured members is omitted. As illustrated in (c) of FIG. 15, the second insulating film 71*b* is provided in a manner so as to cover the first insulating film 51*a*. A contact hole (opening) is formed in the first insulating film 51*a* and the second insulating film 71*b* at a position corresponding to the gate electrode layer 50*da*. A connecting line layer (source layer) 40*aa*, in which the connecting lines 70 are provided, is provided so as to cover a portion of the second insulating film 71*b* which portion includes the contact hole. The planarizing film 72 and the barrier film 73 are provided in this order in a manner so as to cover the connecting line layer 40*aa*. The above configuration makes it possible to achieve an electrical connection between the connecting line layer 40*aa* and the gate electrode layer 50*da*.

The above configuration also makes it possible to form the connecting line layer 40*aa* from, for example, a laminated film including a material such as aluminum (Al) which is inexpensive and has favorable conductivity.

The above examples of a cross-sectional configuration of the connection section are non-limiting. For example, a protective film (polyimide) may be provided between the planarizing film and the barrier film. Because Embodiment 3 involves top gate type TFTs, a semiconductor layer (not illustrated) is provided between the gate insulating film and the base coat film.

The above configurations of Embodiment 3 particularly bring about the effect of decreasing the size of the wiring diverting region provided peripherally to the non-displaying region.

Discussed in each of the above Embodiments was an example configuration in which each connecting line connects a sub gate line not to an adjacent gate line, but to the next gate line beyond the adjacent gate line adjacent. This example is non-limiting, however, and the configuration of the present invention may be altered as necessary. For example, it is possible to employ a configuration in which, in Embodiment 1, each connecting line connects one gate line, of a plurality of gate lines, to a sub gate line which is provided upstream of the one gate line in terms of scan order. It is also possible to employ a configuration in which, in Embodiment 3, each connecting line connects one gate line, of a plurality of gate lines, to a sub gate line which is provided downstream of the one gate line in terms of scan order.

Specifically, with reference to FIG. 1, discussed in Embodiment 1 was an example configuration in which the sub gate line 60(*n*+2) was connected to the gate line 50*n* via the connecting line 70(*n*+2). This example is non-limiting, however. For example, if necessary, it is possible to employ a configuration in which the sub gate line 60(*n*+2) is connected to the gate line 50(*n*−1) via a connecting line.

The above configurations make it possible to improve the degree of freedom in designing the connecting lines, so as to accommodate various driving methods.

[Recap]

A display device (1) in accordance with Aspect 1 includes: a substrate (100) having a displaying region (30) and a non-displaying region (10); a plurality of first switching elements (TFT1 and TFT2); a plurality of gate lines (50) each of which is respectively connected to a gate of one or more of the plurality of first switching elements (TFT1 and TFT2); a plurality of second switching elements (TFT3); a plurality of sub gate lines (60) each of which is respectively connected to a gate of one or more of the plurality of second switching elements (TFT3); and one or more connecting lines (70) each of which connects a respective one of the plurality of gate lines (50) to a respective one of the plurality of sub gate lines (60).

With the above configuration, it is possible to reduce the number of diverting wires corresponding to sub gate lines (60) in a region between the displaying region (30) and the wiring diverting region (20). This makes it possible to reliably cure a sealing material provided peripherally to the non-displaying region (10) and provide a display device (1) having a decreased bezel size.

In Aspect 2 of the present invention, the display device (1) of Aspect 1 may be configured such that the displaying region (30) exists peripherally to at least a part of a perimeter of the non-displaying region (10).

In Aspect 3 of the present invention, the display device (1) of Aspect 1 or 2 may be configured such that: the substrate (100) includes a wiring diverting region (20) provided between the displaying region (30) and the non-displaying region (10); and none of the plurality of sub gate lines (60) exist in the wiring diverting region (20).

With the above configuration, no sub gate lines (60) exist in the wiring diverting region (20). This makes it possible to avoid providing, in the wiring diverting region (20), diverting wires corresponding to the sub gate lines (60).

In Aspect 4 of the present invention, the display device (1) of any one of Aspects 1 to 3 may be configured to further include one or more source lines (40), the one or more connecting lines (70) being provided in a layer differing from both (i) a layer in which the plurality of gate lines (50) are provided and (ii) a layer in which the one or more source lines (40) are provided.

With the above configuration, providing the connecting lines in a layer which differs from both (i) the layer in which the gate lines are provided and (ii) the layer in which the source lines are provided makes it possible to effectively prevent defects such as short circuits between wires.

In Aspect 5 of the present invention, the display device (1) of Aspect 4 may be configured such that the layer in which the one or more connecting lines (70) are provided includes one or more power supply lines (90) to which an initialization voltage is applied.

The above configuration makes it possible to improve the degree of freedom in designing the substrate (100) of the display device (1), without increasing production costs.

In Aspect 6 of the present invention, the display device (1) of any one of Aspects 1 to 3 may be configured to further include one or more source lines (40), the one or more connecting lines (70) being provided in a layer in which the one or more source lines (40) are provided.

The above configuration, too, makes it possible achieve an effect similar to that of Aspect 1.

In Aspect 7 of the present invention, the display device (1) of Aspect 6 may be configured to further include a plurality of storage capacitor lines (80) which are connected to each other via one or more common connecting lines (85), the one or more common connecting lines being provided in the layer in which the one or more source lines (40) are provided.

The above configuration makes it possible to achieve an effect similar to that of Aspect 1 even in a configuration having a plurality of storage capacitor lines provided in a gate layer. Furthermore, in comparison to a configuration in which a transparent conductive film such as ITO or IZO having high wire resistance is used for connecting lines, a configuration in which the connecting lines are provided in the source layer which is also the wiring layer in which common connecting lines are provided makes it possible reduce the resistance of the connecting lines without the need for an additional step. For example, even in a configuration in which the sub gate lines (60) are connected to respective gate lines (50) even further away, the above configuration makes it possible to provide connecting lines (70) having low resistance.

In Aspect 8 of the present invention, the display device (1) of Aspect 7 may be configured such that the one or more common connecting lines (85) are positioned farther from the non-displaying region (10) than are the one or more connecting lines (70).

The above configuration brings about the advantageous effect of allowing curing to be carried out reliably in the sealing region of the display device.

In Aspect 9 of the present invention, the display device (1) of any one of Aspects 1 to 3 may be configured to further include a reflective electrode layer, the one or more connecting lines (70) being provided in the reflective electrode layer.

The above configuration makes it possible to simplify the configuration of the substrate of the display device.

In Aspect 10 of the present invention, the display device (1) of any one of Aspects 1 to 9 may be configured such that each one of the one or more connecting lines (70) connects one gate line, of the plurality of gate lines (50), to one sub gate line, of the plurality of sub gate lines (60), which one sub gate line is positioned downstream of the one gate line in terms of scan order.

The above configuration makes it possible to improve the degree of freedom in designing the connecting lines (70), so as to accommodate various driving methods.

A liquid crystal display device (1) in accordance with Aspect 11 of the present invention includes the display device according to any one of Aspects 1 to 10 and is configured such that each of the plurality of second switching elements (TFT3) is connected to a respective one of a plurality of storage capacitors.

With the above configuration, the liquid crystal display device (1) makes it possible to reliably control the application of a current to pixels with use of the storage capacitors.

An organic EL display device (1) in accordance with Aspect 12 of the present invention includes the display device according to any one of Aspects 1 to 10 and is configured such that each of the plurality of second switching elements (Tr1) is connected to a respective one of a plurality of wires 60'$b$ to which a constant electric potential is supplied.

With the above configuration, the organic EL display device (1) makes it possible to reliably control electric potential with use of the wires 60'$b$.

The present invention is not limited to the embodiments, but can be altered by a skilled person in the art within the scope of the claims. The present invention also encompasses, in its technical scope, any embodiment derived by combining technical means disclosed in differing embodiments. It is possible to form a new technical feature by combining the technical means disclosed in the respective embodiments.

REFERENCE SIGNS LIST 1, 1$a$ 1$f$ to if Display device
2 Flexible printed circuit board
3, 3$a$ Unit pixel
4 Source driving section
5 Gate driving section
10 Non-displaying region
20 Wiring diverting region
30 Displaying region
40, 40$a$, 40($a$+1), 40$b$ Source line
50 Gate line
60 Sub gate line
70 Connecting line
80 Storage capacitor line
85 Common connecting line
90 Power supply line
91 Reflective electrode
92, 92' Anode-electrode-side power supply line
100, 100$a$, 100$b$ Substrate
TFT1, TFT2 First switching element
TFT3 Second switching element
Tr1 to Tr7 Transistor

The invention claimed is:
1. A display device comprising:
a substrate having a displaying region and a non-displaying region;
a plurality of first switching elements;
a plurality of gate lines each of which is respectively connected to a gate of one or more of the plurality of first switching elements;
a plurality of second switching elements;
a plurality of sub gate lines each of which is respectively connected to a gate of one or more of the plurality of second switching elements;
one or more connecting lines each of which connects a respective one of the plurality of gate lines to a respective one of the plurality of sub gate lines;
one or more source lines; wherein
the one or more connecting lines are provided in a layer differing from both (i) a layer in which the plurality of gate lines are provided an (ii) a layer in which the one or more source lines are provided.
2. The display device according to claim 1, wherein the displaying region exists peripherally to at least a part of a perimeter of the non-displaying region.

3. The display device according to claim 1, wherein:
the substrate includes a wiring diverting region provided between the displaying region and the non-displaying region; and
none of the plurality of sub gate lines exist in the wiring diverting region.

4. The display device according to claim 1, wherein the layer in which the one or more connecting lines are provided includes one or more power supply lines to which an initialization voltage is applied.

5. The display device according to claim 1, wherein each one of the one or more connecting lines connects one gate line, of the plurality of gate lines, to one sub gate line, of the plurality of sub gate lines, which one sub gate line is positioned downstream of the one gate line in terms of scan order.

6. A liquid crystal display device comprising the display device recited in claim 1,
wherein each of the plurality of second switching elements is connected to a respective one of a plurality of storage capacitors.

7. An organic EL display device comprising the display device recited in claim 1,
wherein each of the plurality of second switching elements is connected to a respective one of a plurality of wires to which a constant electric potential is supplied.

8. A display device comprising:
a substrate having a displaying region and a non-displaying region;
a plurality of first switching elements;
a plurality of gate lines each of which is respectively connected to a gate of one or more of the plurality of first switching elements;
a plurality of second switching elements;
a plurality of sub gate lines each of which is respectively connected to a gate of one or more of the plurality of second switching elements;
one or more connecting lines each of which connects a respective one of the plurality of gate lines to a respective one of the plurality of sub gate lines;
one or more source lines; and
a plurality of storage capacitor lines which are connected to each other via one or more common connecting lines.

9. The display device according to claim 8, wherein the displaying region exists peripherally to at least a part of a perimeter of the non-displaying region.

10. The display device according to claim 8, wherein:
the substrate includes a wiring diverting region provided between the displaying region and the non-displaying region; and
none of the plurality of sub gate lines exist in the wiring diverting region.

11. The display device according to claim 8, wherein the one or more common connecting lines are positioned opposite to the non-display region with respect to corresponding one of the one or more collecting lines.

12. The display device according to claim 8, wherein each one of the one or more connecting lines connects one gate line, of the plurality of gate lines, to one sub gate line, of the plurality of sub gate lines, which one sub gate line is positioned downstream of the one gate line in terms of scan order.

13. An organic EL display device comprising the display device recited in claim 8,
wherein each of the plurality of second switching elements is connected to a respective one of a plurality of wires to which a constant electric potential is supplied.

14. A display device comprising:
a substrate having a displaying region and a non-displaying region;
a plurality of first switching elements;
a plurality of gate lines each of which is respectively connected to a gate of one or more of the plurality of first switching elements;
a plurality of second switching elements;
a plurality of sub gate lines each of which is respectively connected to a gate of one or more of the plurality of second switching elements;
one or more connecting lines each of which connects a respective one of the plurality of gate lines to a respective one of the plurality of sub gate lines; and
a reflective electrode layer; wherein
the one or more connecting lines are provided in the reflective electrode layer.

15. The display device according to claim 14, wherein the displaying region exists peripherally to at least a part of a perimeter of the non-displaying region.

16. The display device according to claim 14, wherein:
the substrate includes a wiring diverting region provided between the displaying region and the non-displaying region; and
none of the plurality of sub gate lines exist in the wiring diverting region.

17. The display device according to claim 14, wherein each one of the one or more connecting lines connects one gate line, of the plurality of gate lines, to one sub gate line, of the plurality of sub gate lines, which one sub gate line is positioned downstream of the one gate line in terms of scan order.

18. An organic EL display device comprising the display device recited in claim 14,
wherein each of the plurality of second switching elements is connected to a respective one of a plurality of wires to which a constant electric potential is supplied.

* * * * *